(12) United States Patent
Heikkonen et al.

(10) Patent No.: US 8,645,111 B2
(45) Date of Patent: Feb. 4, 2014

(54) MAGNETIC CONTROL PLANE

(75) Inventors: Teemu Heikkonen, Helsinki (FI); Iiro Ojala, Espoo (FI); Ville Rousu, Espoo (FI); Pertti Alho, Helsinki (FI); Jukka Partanen, Espoo (FI); Jukka Suomi, Espoo (FI); Ragnar Wessman, Espoo (FI)

(73) Assignee: Tekla Corporation, Espoo (FI)

( * ) Notice: Subject to any disclaimer, the term of this patent is extended or adjusted under 35 U.S.C. 154(b) by 1477 days.

(21) Appl. No.: 11/117,440

(22) Filed: Apr. 29, 2005

(65) Prior Publication Data

US 2005/0285881 A1    Dec. 29, 2005

Related U.S. Application Data

(60) Provisional application No. 60/576,036, filed on Jun. 2, 2004.

(30) Foreign Application Priority Data

Apr. 30, 2004   (FI) .................................... 20040626

(51) Int. Cl.
  *G06G 7/48*   (2006.01)
  *G06G 5/00*   (2006.01)
(52) U.S. Cl.
  USPC ............................................ 703/6; 345/624

(58) Field of Classification Search
  USPC ...................... 703/1, 2, 6; 345/650, 661, 672
  See application file for complete search history.

(56) References Cited

U.S. PATENT DOCUMENTS

| | | | | |
|---|---|---|---|---|
| 4,017,604 | A | * | 4/1977 | Naden et al. ........................ 365/2 |
| 5,513,310 | A | * | 4/1996 | Megard et al. ................. 715/810 |
| 5,519,462 | A | * | 5/1996 | Spencer et al. ................ 396/319 |
| 5,856,828 | A | * | 1/1999 | Letcher, Jr. .................... 345/420 |
| 6,632,548 | B2 | * | 10/2003 | Saito et al. ..................... 428/841 |

FOREIGN PATENT DOCUMENTS

| | | |
|---|---|---|
| JP | 2002-215683 | 8/2002 |
| WO | WO 02/03259 | 1/2002 |

* cited by examiner

*Primary Examiner* — Kamini S Shah
*Assistant Examiner* — Andre Pierre Louis
(74) *Attorney, Agent, or Firm* — Young & Thompson (57) ABSTRACT

Modification of a model in situations, where one end of several parts should be transferred for the same distance, for instance, has posed a problem in modeling systems. The problem can be solved by defining a magnetic control plane to which model part handles locating thereon will adhere without separate definitions given by the user and they move (406) along with the plane. The only thing the user needs to do is to create a plane and to define the plane type to be a magnetic control plane. On the basis of these data given by the user the modeling system knows what to transfer when the magnetic control plane is transferred.

22 Claims, 4 Drawing Sheets

MAGNETIC CONTROL PLANE

FIELD OF THE INVENTION

The invention relates to computer-aided modeling and in particular to enabling modification of a model, such as to simultaneous transfer of a plurality of parts or one end of the parts locating on the same plane.

BACKGROUND OF THE INVENTION

Modeling means that an object is represented by a model. The development of data processing systems and computers has transformed the modeling into a computerized process, in which a model is created by defining parts each having handles and given characteristics, such as a first end, a second end, location and a shape. The objective of the modeling is to make the model work in the same way as its real-world object and that the model provides information, by means of which the object can be implemented in the real world. Typically the model "lives" in the course of modeling and every now and then a situation arises, where one end of several different parts need to be transferred a given distance. In these situations prior art modeling systems require that in an alteration situation the ends of the modeled parts be shifted one by one to a new location, augmented the selected parts up to a particular location (e.g. so-called trim functionality), or prior to the transfer they have had to be attached one by one to a transferable object, for instance, to a lower side of a bar, whereby the transfer of the object makes the parts attached thereto to move. Modification may also be based on selection of one or more handles, and by dragging the handle(s) it is possible to modify or shift the object. Even the handles must be selected one by one. In particular in a three-dimensional picture the selection of handles, or any selection made by the user, may be difficult, because the desired handle may be located under some other handle. Selection or transfer one by one also poses a risk that the user forgets one of the objects and consequently it will not be transferred.

A problem with all the prior art solutions is that making alterations is both cumbersome and liable to errors, which may result in situations, where the model does not correspond to what was intended.

BRIEF DESCRIPTION OF THE INVENTION

The object of the invention is thus to provide a method and equipment implementing the method to the effect that the above problem can be solved such that the objects to be modified need not be selected separately. The object of the invention is achieved with a method, a system and a computer software product, which are characterized by what is disclosed in the independent claims. The preferred embodiments of the invention are disclosed in the dependent claims.

The invention is based on a magnetic control plane, to which handles of model parts locating thereon adhere without specific definitions provided by the user and the handles, for instance, move along with the plane if the plane is transferred. The only thing the modeler, i.e. the user, needs to do is to create a plane and define the plane magnetic at some stage of modeling. On the basis of this data provided by the user the modeling system knows all that needs to be transferred when transferring the magnetic control plane.

The invention has an advantage that it enables implementation of extremely complicated transfers and stretches in an easy and user-friendly manner. For instance, if a wall line is shifted, it will suffice in the solution of the invention that the wall line will be defined as a magnetic surface, whereafter the handles on the wall line, such as the handles of the beams and the slabs, will be shifted accordingly, whereas in the prior art solution it would be necessary to shift the ends of the slabs and each individual beam either separately or attached to the wall line, otherwise a beam, for instance, would either exceed the wall line or fall short of it.

BRIEF DESCRIPTION OF THE DRAWINGS

In the following the invention will be described in greater detail in connection with preferred embodiments with reference to the attached drawings, in which.

DETAILED DESCRIPTION OF THE INVENTION

The present invention can be applied in connection with any template-based modeling or -drawing system, including so-called CAD-type systems and systems based on parametric modeling. In CAD-type systems a modeled part consists of edges, and the shape and size of the part are the essence of the modeled part. In those systems a beam, for instance, is modeled by drawing each side of the beam, whereafter they are assembled into a beam with a shape and size being an integral part thereof. The invention is particularly well suited for modeling systems, in which the physical characteristics of a piece are indicated by attributes, i.e. by using parameters. In other words, in those systems the modeled object is not bound to the physical characteristics of the part, but the geometry of the object can be created by means of various parameters when necessary. In parametric modeling a beam can be modeled, for instance, by giving it a start point and an end point and various definitions that determine the physical characteristics of the beam. In parametric systems it is thus possible to model the beam such that the shape and size of the beam are no longer physically associated with the beam.

In the following the invention will be described using an exemplary system, in which the modeling program according to the invention is based on parametric modeling and the program is run on a personal computer utilizing a run-time database and a so-called random access memory without restricting the invention to solutions in the exemplary system. The run-time database comprises data to be stored in a disk memory, and data already store therein, on an overall object modeled, or to be modeled, for instance, on a building. The run-time database may also be located in the main memory. In another embodiment of the invention it is possible to utilize, for instance, an object database or a relational database, which are used via a network, for instance, from one or more terminal devices. Some other embodiments of the invention only utilize data in the random access memory, which are never stored and which will be erased, when the work to be processed is closed. Various programming techniques, data storing in the memory and implementations of databases, as well as the use of the Internet for data transmission and as a common application platform, are under constant development. This development may require extra changes in the invention. Therefore, all terms and expressions should be interpreted broadly, and they are intended to illustrate, not to restrict, the invention.

Figure 1:
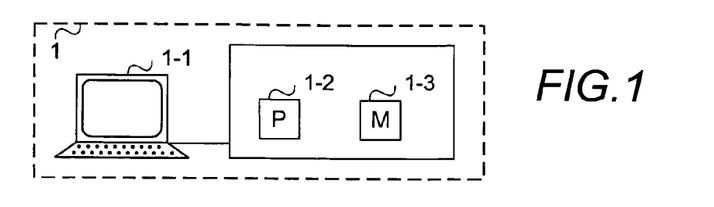
FIG. 1 is a simplified block diagram of the architecture of an exemplary system.

FIG. 1 shows a simplified modeling system and it only depicts the most substantial parts of the logic units in the system, the implementation of which may deviate from what is shown. It is apparent to a person skilled in the art that the system may also comprise other functions and structures that need not be described in greater detail herein. A more detailed structure of the system is irrelevant to the actual invention.

The modeling system 1 illustrated in FIG. 1 comprises a personal computer having a user interface 1-1, a processor 1-2 and memory 1-3.

The user interface 1-1 is the interface of a user, i.e. a person processing the model, to the modeling system. Through the interface the user can create a model, modify the model, view it, print out desired images, reports, etc. How data are entered in the modeling system is not relevant to the invention. The manners to provide data described below are only given as examples and they do not restrict the invention in any way.

According to different embodiments of the invention, the processor 1-2 executes operations of the invention. The data optionally stored in the memory 1-3 according to the invention vary from one embodiment to another and they will be described later on in the text. In the exemplary system, the data to be stored are stored in a memory, for instance, in a file, and the data stored and to be stored during processing will be a so-called database in the main memory, into which the stored data are read from the disk memory and where their processing is faster. When processing is finished, the database data, or at least the changed data, are stored in the disk memory. It is apparent to a person skilled in the art that data can be stored in one or more files and/or they can be stored/processed in another format and/or using other memories. In addition to the database, the memory 1-3 comprises a so-called random access memory, where process-time data may be maintained, i.e. the data that will not be stored when the processing is over.

The modeling system set forth in FIG. 1 represents the simplest modeling system. In larger modeling systems the user interface can be a terminal device and the memory, or part of the memory, can be a database, with which the terminal device communicates through a server. The server executes functions of the processor in the exemplary system, or at least some of them, whereby the terminal device may also execute the processor functions of the exemplary system. Between the terminal device and the server there may be one or more networks, for instance, the Internet. They may comprise several terminals and several servers with their databases, which are advantageously integrated such that the user sees them as one database and one database server. It is irrelevant to the invention whether the following system functions are executed in a terminal device, on a database server, or such that some of them are executed in the terminal and some on the database server, i.e. where the data are processed. Correspondingly, it is irrelevant to the invention where the random access memory and the database or the like are located.

Figure 2A:
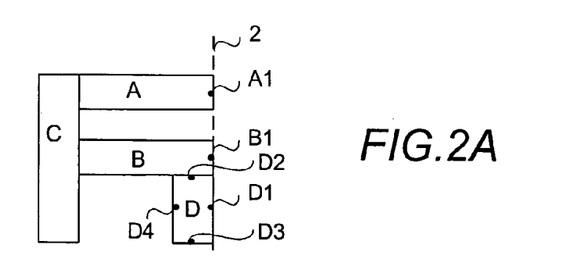
FIGS. 2A, 2B, 2C and 2D illustrate a magnetic control plane and its basic types.
Figure 2B:
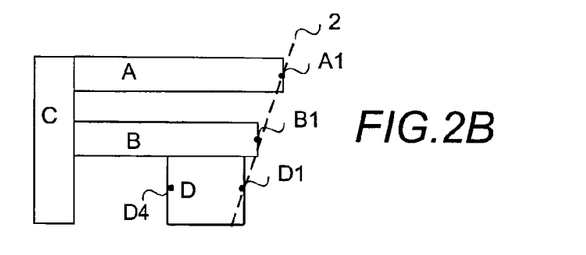
Figure 2C:
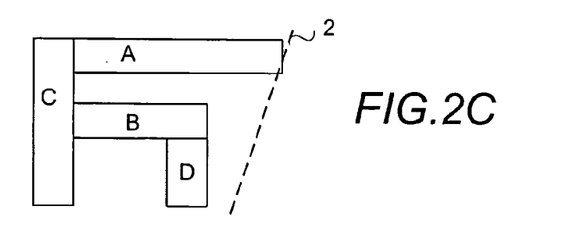
Figure 2D:
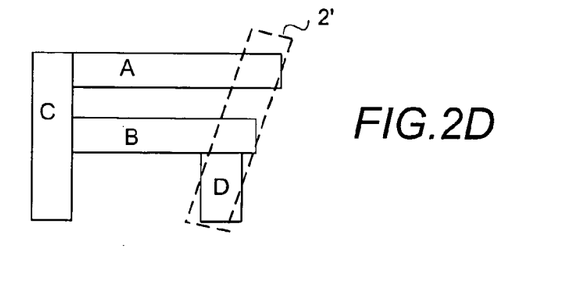

For the sake of clarity, FIG. 2A shows the definition of a magnetic plane two-dimensionally and FIGS. 2B, 2C and 2D illustrate two different basic types of the magnetic plane of the invention with their effects. Due to the two-dimensional presentation the magnetic control plane 2 is shown as a broken line in FIGS. 2A, 2B, 2C and 2D.

In FIG. 2A there is modeled an object that comprises at least parts A, B, C and D. In addition, the object is modeled to have a magnetic control plane 2, on which there are handle A1 of part A, handle B1 of part B and handle D1 of part D. Other handles D2, D3 and D4 of part D are not located on the magnetic control plane, and, for the sake of clarity, other handles of parts A, B and C are not shown in FIG. 2A. A handle refers to a point that allows the part to be grabbed and when it is shifted, the shape and/or location of the part will change. The handle can be determined separately, for instance, while modeling, one can enter information "midpoint of the left corner side comprises a handle". Typically the determination point of a part, i.e. the point, by means of which the modeling system creates the part, is also a handle. However, this is not necessarily the case. In parametric modeling handles (and determination points) may include start and end points of the part, a logical plane with which the part is associated, a point calculated on the basis of the parameters of the part, e.g. an intersection of the top surface and end surface of the beam, etc. The invention does not restrict in any way the handle or its location, or set any requirements thereto. Also, the order in which the different parts and the magnetic control plane are created is irrelevant to the invention. It is possible that the model was created, for instance by first creating part C, then the magnetic control plane 2 and thereafter parts A, B and D, or by first creating parts A, B, C and D and then the magnetic control plane 2, or by first creating parts A and D, then the magnetic control plane 2 and thereafter parts B and C, or the creation of the model may have started by creating the magnetic control plane. The fact that the magnetic control plane can be determined any time provides an advantage that the invention can be applied to existing old models. In addition, it makes the user's work easier, because he or she need not know in advance possible locations of the magnetic control plane or wait that the model is completed before the magnetic control plane is defined. The magnetism of the plane can also be switched off at any stage of modeling. The switched-off magnetism can be switched on again later. When the magnetism is switched off, the plane behaves like any other ordinary plane. The definitions of the magnetic control plane advantageously remain in the memory, even though the magnetism of the plane is switched off. Alternatively, the definitions of the magnetic control plane can be deleted on switching off the magnetism of the plane. The fact that the magnetism can be switched off, when necessary, provides an advantage that the same plane can also be used for other purposes than just for the magnetic control plane. To switch off the magnetism makes it possible that the plane is moved to another location without that the handles on the plane move along.

The magnetic control plane is generally an auxiliary plane, which is not part of the actual model, but the magnetic control plane of the invention may also be an actual model plane, for instance a slab or a top surface of a slab. Advantageously the magnetic control plane is a finite surface, but it may also be an infinite surface. The magnetic control plane may be a plane that is defined like any other plane by three points that are not located on the same straight line. In some embodiments the user may also define thickness for the magnetic control plane. In any case, the magnetic control plane advantageously has thickness to correspond at least to the calculation accuracy of the computer. This is to ensure that the handles appearing on the magnetic control plane will be taken along, even though a slight measuring error would have been made in connection with modeling. The magnetic control plane may be in any arbitrary position in the three-dimensional space and it can be moved arbitrarily, for instance, by rotation, reflection, shifting horizontally or vertically, etc. It does not have to be a planar surface, but it may be a three-dimensional surface, for instance, a wavy surface or an undulating surface or a surface of a function. The surface may also be planar on one side and three-dimensional, e.g. wavy, on the other side.

There are two basic types of magnetic control planes: one with selective magnetism and the other with non-selective magnetism. The difference between these two basic types does not appear until the magnetic control plane is moved. This difference is illustrated in FIGS. 2B and 2C.

The magnetic control plane of FIG. 2B is non-selective, i.e. all handles appearing on the magnetic control plane adhere to the plane. So, the shift of the magnetic control plane from the location of FIG. 2A to the location of FIG. 2B provides a corresponding shift for all handles on the magnetic control plane. In the example of FIGS. 2A and 2B handles A1, B1 and D1 move and the modeled parts A, B and D will change accordingly. If part D had been defined only having handle D1, the appearance of part D would have remained the same, but the part would have shifted for the same amount as the shift of the magnetic control plane 2. However, in the example of FIGS. 2A and 2B handles D2, D3 and D4 of part D did not adhere to the magnetic control plane.

The magnetic control plane of FIG. 2C is defined selective, i.e. the handles appearing on the magnetic control plane do not necessarily adhere to the plane. Definition of selectivity may consist in defining what adheres to the magnetic control plane. Alternatively, definition of selectivity may consist in defining what does not adhere to the magnetic control plane. In the example of FIG. 2C the definition of the magnetic control plane is such that the handle (or handles) of part A adheres to the magnetic control plane 2, but those of parts B and D do not. So, the shift of the magnetic control plane from the position shown in FIG. 2A to the position shown in FIG. 2C provides a corresponding shift of all handles appearing on the magnetic control plane and adhering to the magnetic control plane. In the example of FIG. 2C just handle A1 moves and the modeled part A changes accordingly, parts B and D remain the same. Selectivity can be defined when the plane is defined, or later on, for instance, if it is noted in the course of the shift that all parts should not follow. Selectivity can also be changed during modeling. Selectivity can be defined, for instance, on the basis of the material used (steel adheres, concrete does not), on the basis of the type of the part (beam adheres, slab does not), on the basis of location (those on the third floor level do not adhere, those on the first, second, fourth floor levels and up adhere) or as a combination thereof. It is also possible that a feature is associated with the handle, on the basis of which the selectivity can be defined. The invention does not restrict in any way, how the selectivity is defined, the above examples only illustrate the invention.

If all handles of the modeled part appear on the magnetic control plane and they are such that they adhere to the plane, the modeled part will advantageously move as a whole. Thus the magnetism can also be utilized when the intention is only to move the modeled object. This is illustrated in FIG. 2D. In the example of FIG. 2D the magnetic control plane may be non-selective or it may be defined selective such that the handles of parts A, B and D adhere thereto. The magnetic control plane 2' is also defined to have thickness such that all handles of part D touch the magnetic control plane 2'. So, the whole part D moves (situation in FIG. 2A intended as a starting situation), but parts A and B are stretched. How the whole part D moves depends on the handle definitions. It is assumed in FIG. 2D that the handles are defined to allow a side transfer such that the original definition direction of the side (e.g. vertical, horizontal etc.) remains the same. If the handles were defined to allow a side transfer, for instance, part D would become oblique. Whereas, if the same or simultaneous transfer of all handles of one part is defined as the whole part transfer, the piece would advantageously become a rhombus that is attached to part D at one point after the transfer in FIG. 2D. There are numerous different definition alternatives and the invention will not restrict them and the use thereof in any way.

The magnetic control plane can also be utilized during modeling as a so-called snap surface, i.e. an auxiliary surface, in creating new objects or in moving the existing ones. By means of the snap surface it is possible to trim the beam heads to be on the same plane. Like the magnetic control plane, the snap functionality can also be selective.

Figure 3:
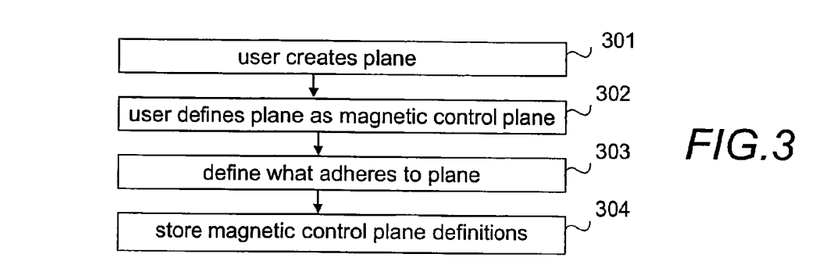
FIGS. 3 and 4 illustrate an embodiment of the invention.
Figure 4:
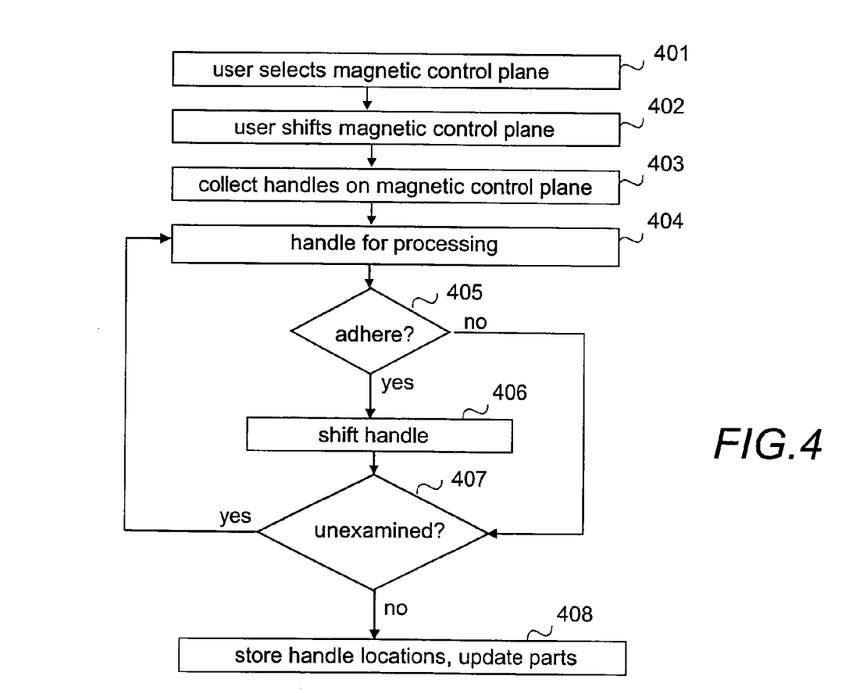

FIGS. 3 and 4 illustrate an embodiment of the invention in which the magnetic control plane is always of selective type, but it allows, however, definition of selectivity such that all handles on the magnetic control plane may adhere thereto. In a first example the implementation of the magnetic control plane is based on geometric relations between the magnetic control plane and the handles, i.e. on relations that are not stored in the database. These relations are also called implicit relations.

FIG. 3 illustrates how the magnetic control plane is created in the embodiment in question. In step 301 the user creates a surface by defining the location and size of the surface. The size may be infinite or finite and the surface may have any shape, for instance, rectangular or "amebic". Thereafter, in step 302 the user defines the created surface as a magnetic control plane and in step 303 defines which items will adhere to the magnetic control plane. When the user has given these definitions, the magnetic control plane definitions are stored in the database in step 304.

In the embodiment the definitions of the magnetic control plane are not used until the plane is transferred. This is illustrated in FIG. 4. When the user selects (step 401) and transfers (step 402) the magnetic control plane, the handles locating on the selected magnetic control plane prior to the transfer are collected in a random access memory in step 403. Collecting is based on the geometric data on the model parts and the definitions of the magnetic control plane in the database. In this embodiment the location of the magnetic control plane prior to transfer is maintained in the random access memory for the time it takes to collect the handles. Thereafter the handles in the random access memory are examined one by one. First, in step 404, a handle is picked up for processing, thereafter, in step 405 it is checked whether the handle will adhere to the magnetic control plane. If that handle is adhesive, it is transferred in step 406 to correspond the transfer of the magnetic control plane. Then, in step 407 it is checked whether there are handles that have not yet been examined. If there are, step 404 is returned to and the next handle is picked up for processing and the process will proceed from step 404 onwards.

When all handles have been examined (step 407), the handle locations that were changed are advantageously stored in the database in step 408 and an updated model is displayed to the user.

If the examined handle is one that does not adhere to the magnetic control plane (405), step 407 is proceeded to directly in order to check whether there still are unexamined handles.

Even though the above describes, for the sake of clarity, that the handles are transferred one by one, it is apparent to a person skilled in the art that the handles can be transferred simultaneously.

In another embodiment of the invention, magnetic control plane selection by the user generates collection of handles locating on the magnetic control plane into a random access memory, i.e. step 403 is executed prior to step 402 or simultaneously therewith. If the magnetic control plane were not transferred after point 401, but the user would have selected another part of the model, for instance, in this embodiment the handles collected in step 403 are released, and subsequently when the user selects a magnetic control plane, all steps of the figure are repeated in this embodiment.

The embodiment illustrated with FIGS. 3 and 4 has an advantage that handles on the magnetic control plane are not collected in vain, but they are collected when they are likely to be needed. A further advantage is that during modeling there will be no need to monitor whether handles will appear on the plane defined as the magnetic control plane in connection with modeling after defining the plane as the magnetic control plane, because all handles locating on the magnetic control plane at the moment of transfer will be collected and checked in connection with the transfer. It is also an advantage that if the magnetism of the plane is cancelled and the plane was not moved while it was magnetic, data is not collected unnecessarily.

In the above embodiments there is an implicit relation between the magnetic control plane and the handles thereon, i.e. a relation that is found out when necessary. In another embodiment of the invention the relation is explicit, i.e. the handles on the magnetic control plane are collected in a random access memory when the definition of the magnetic control plane is stored in a database, i.e. after step 304 in FIG. 3. In this embodiment it is monitored in connection with modeling whether parts with a handle or handles on the magnetic control plane are being modeled, and when such a handle is detected, it is added to the handles of said magnetic control plane in the random access memory. When the user selects a magnetic control plane, handles are not collected in this embodiment, but after the transfer of the magnetic control plane the handles in the random access memory are examined in the above-described manner (steps 404 to 408). In other words, step 402 is omitted in FIG. 4. It is also possible that only handles that adhere to the plane are stored in the random access memory. In this embodiment all handles in the random access memory are transferred, because their adhesion need not be checked again. If the magnetism of the plane is cancelled, the handles associated with the plane are advantageously deleted from the random access memory by releasing their memory locations. It is also possible to retain them in the memory and if the plane is rendered magnetic again to start monitoring, and depending on the embodiment, either to update in the memory the handles on the plane that were modeled during the time the magnetism was off, or to leave them non-updated. The latter option provides a kind of selective magnetism: handles modeled at a given time interval do not adhere to the magnetic control plane. The same can also be implemented by means of time stamps, for instance; the parts that adhere and the ones that do not are filtered on the basis of the time stamps. Instead of the time stamps, the filter may also use some other feature of the part.

Figure 5:
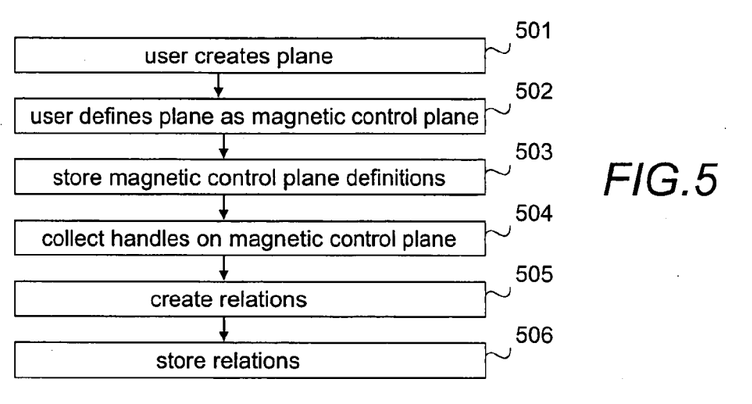
FIGS. 5, 6 and 7 illustrate another embodiment of the invention.
Figure 6:
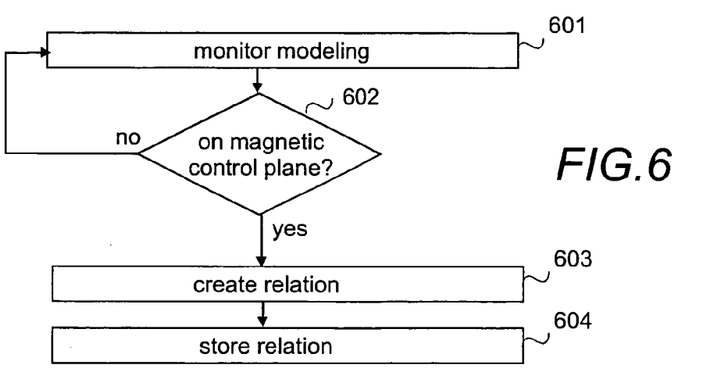
Figure 7:
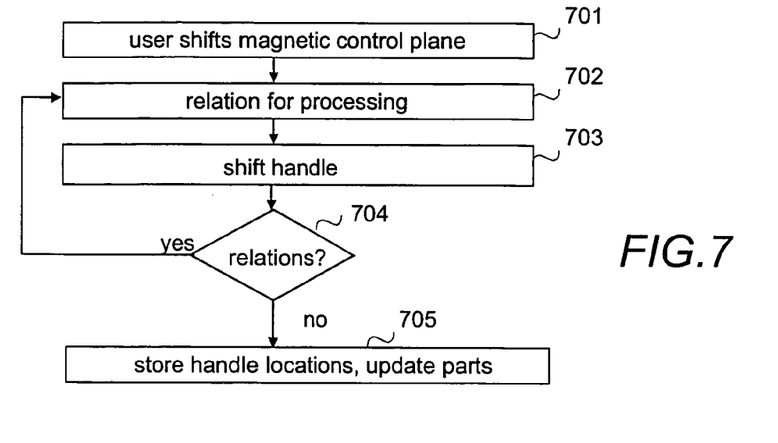

FIGS. 5, 6 and 7 illustrate another embodiment of the invention in which the magnetic control plane is always of non-selective type and the implementation of the magnetic control plane is based on explicit relations between the magnetic control plane and the definition points, i.e. relations that are created and stored in a database.

FIG. 5 illustrates how a plane is created in the embodiment. In step 501 the user creates a plane by defining the location and size of the surface. The size may be infinite or finite and the plane may have any shape, for instance, rectangular or "amebic". Thereafter, in step 502 the user defines the created plane as a magnetic control plane. When the user has given these definitions, the magnetic control plane definitions are stored in the database in step 503. Thereafter, handles appearing on the just created magnetic control plane are collected in step 504, explicit relations between the handles and the magnetic control plane are created in step 505 and the relations are stored in a database in step 506. Collecting is based on geometric data on the model parts and on definitions of the magnetic control plane in the database.

FIG. 6 illustrates the operation of the exemplary system after the magnetic control plane has been created and the user continues modeling elsewhere. In this embodiment it is monitored in connection with modeling, in step 601, whether parts with their handles on the magnetic control plane are being modeled (step 602). When such a handle is detected (step 602), a relation between the handle and the magnetic control plane is created in step 603 and it is stored in step 604 among the relations of said magnetic control plane in the database and the monitoring of modeling is continued from step 601.

In this embodiment the relations are employed when the user transfers the magnetic control plane. This is illustrated in FIG. 7. When the user transfers the magnetic control plane (step 701), the relations of the magnetic control plane in the database are examined one by one. First, a relation is picked up for processing (step 702), thereafter the handle indicated by the relation is transferred in step 703 to correspond to the transfer of the magnetic control plane. Thereafter it is checked in step 704, whether there still are unexamined relations. If there are, step 702 is returned to in order to pick up the next relation for processing and the process continues from step 702 onwards.

If all handles have been examined (step 704), in step 705 the new locations of the handles are stored in the database and an updated model is displayed to the user.

If in this embodiment of the invention the magnetism of the plane is cancelled, the relations are advantageously deleted from the memory by releasing their memory locations. It is also possible to retain the relations in the memory and if the plane is rendered magnetic again to start monitoring, and depending on the embodiment, either to update in the relations the handles on the plane that were modeled during the time the magnetism was off, or to leave them non-updated. The latter option provides a kind of selective magnetism: handles of the objects modeled at a given time interval do not adhere to the magnetic control plane.

Figure 8:
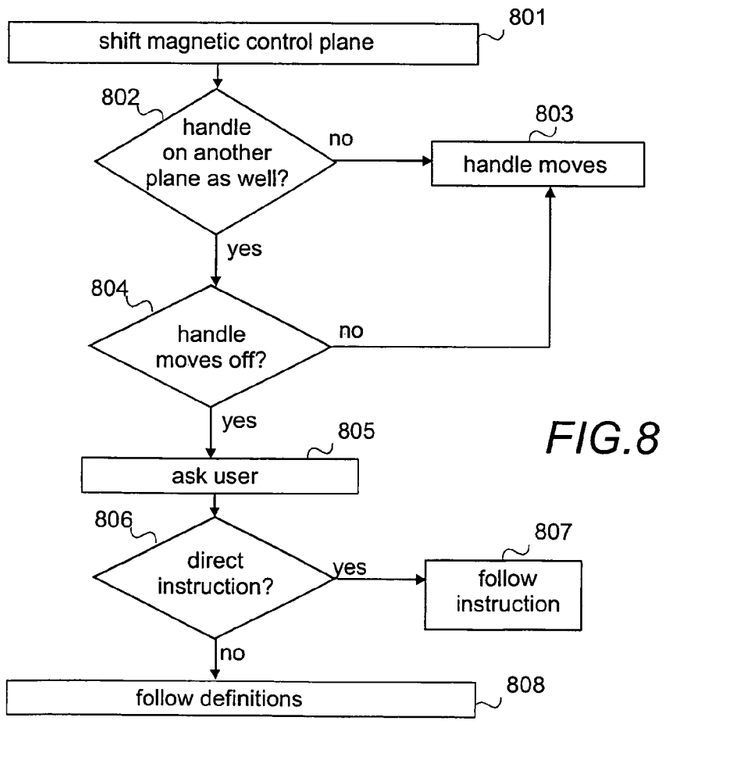
FIG. 8 illustrates transfer of a single handle in accordance with the invention.

For the sake of clarity, it is assumed in the above embodiments that there exists just one magnetic control plane on which a handle may be located. This is not necessarily the case, but an individual handle may be located on a plurality of magnetic control planes. FIG. 8 illustrates transfer of a magnetic control plane X from a viewpoint of one individual handle in an embodiment of the invention. FIG. 8 starts from the fact that the magnetic control plane X, on which the handle is located and to which the handle adheres, is moved in step 801. At this stage it is irrelevant whether there is an explicit or implicit relation between the handle and the magnetic control plane X and whether the magnetic control plane is selective or not, but it is assumed, for the sake of clarity, that the handle adheres to the magnetic control plane.

When it is detected that the magnetic control plane X with a handle adhering thereto is being transferred (step 801), it is checked in step 802 whether the handle simultaneously appears on another magnetic control plane. If not, the handle will be transferred in accordance with the magnetic control plane X in step 803. If the handle simultaneously appears on another, optionally on several magnetic control planes (step 802), it is checked in step 804 whether the handle moves off one of the magnetic control planes to which it adheres if it is transferred in a corresponding manner with the magnetic control plane X. In other words, in step 804 it is checked whether the handle is able to stay on all the magnetic control planes, to which it adheres. If, as a result of the magnetic control plane transfer, the handle does not move off the other magnetic control planes to which the handle adheres, the handle is able to stay on all magnetic control planes even after the transfer and the handle shifts in accordance with the magnetic control plane in step 803.

If it is detected (step 804) that the handle transfer corresponding to that of the magnetic control plane X makes the handle move off at least one other magnetic control plane on which it should appear (i.e. to which it adheres) a contradiction arises. In the example illustrated in FIG. 8 the modeling program is arranged to ask the user for an instruction in step 805 in a contradicting situation of this kind to the effect that the user can give either a direct instruction or an indirect instruction. The direct instruction means here that the user indicates either that the handle moves along with the magnetic control plane X or that the handle does not move along with the magnetic control plane X. The indirect instruction means that the user indicates that the fact whether the handle moves along with the magnetic control plane X or not is determined together with the definitions of the modeling program.

If a direct instruction was obtained from the user (step 806), step 807 is performed in accordance with the obtained direct instruction.

If no direct instruction, but an indirect one, was obtained from the user (step 806), step 808 is performed in accordance with the definitions of the modeling program. They may include a hierarchy for various magnetic planes, for instance. The hierarchy may be based, for instance, on the type of the magnetic control plane, on how selective the magnetic plane is, on how large proportion of the relations are explicit relations and/or on the creation order of the magnetic control planes and/or on the characteristics of the handle. The handle may move, for instance, if it stays on the magnetic control plane to which it adhered first explicitly or implicitly. The magnetic control planes may also have an internal hierarchy of their own, whereby the handle may move if it stays on the magnetic control planes that are higher up in the hierarchy than the magnetic control plane X. It should be emphasized that the invention does not restrict the definition rules needed in a contradicting situation in any way.

In an embodiment of the invention the user may have to give a direct instruction and the modeling program need not be provided with internal definitions for contradicting situations. Correspondingly in an embodiment of the invention the user is not asked anything, but in a contradicting situation the operation follows the internal definitions alone. When explicit relations are used it is also possible to prevent the contradicting situations in such a way, for instance, that prior to forming a relation it is checked whether any one relation is already associated with the handle, and the relation is only formed if no relation is associated with the handle. It is also possible that on defining the magnetic control plane the modeling program detects the contradicting situations and asks the user how to act in a contradicting situation. The modeling program of the invention can also be implemented such that it will not detect contradicting situations but moves the handle irrespective of its adherence to another magnetic control plane as well.

The steps in FIGS. 3, 4, 5, 6 and 7 are not in the absolute chronological order, and they can be performed in an order that differs from what is given, or simultaneously. For instance, adherence can be checked in the collecting step or on storing the relations such that only the adhesive handles will be collected or their relations stored. Other operations can be carried out between the described steps, for instance, between creating a plane and defining it a magnetic control plane (steps 301 and 302 as well as 501 and 502), or before transferring the handle (step 406 and 703) it can be checked, in accordance with FIG. 8, how the handle is transferred. Other operations can be performed simultaneously with the described operations. Some of the steps described in the figures may also be omitted. Some of the described steps may be replaced by a step that gives a corresponding result. In addition, the definitions of the magnetic control plane, such as thickness or what will adhere to the plane, can be changed any time during the modeling.

Even though the invention is described above on the assumption that the definition of the magnetic control plane is stored in the model such that the once defined plane can be used several times, it is apparent to a person skilled in the art that the definitions of the magnetic control plane may also be located in the random access memory alone, whereby they will disappear when the processing of the model is over. The control plane may also be a completely temporary plane, whereby the control plane definitions remain in the random access memory only for the duration of the use of the control plane (definition and subsequent transfer). If the magnetic control plane is needed when the model will be subsequently processed, it will have to be redefined. This kind of an embodiment has an advantage that the definitions are not stored unnecessarily in the model, nor will they unnecessarily increase the memory and processing capacity required by the model.

Even though the invention is described above, for the sake of clarity, by means of embodiments that support only one basic type of the magnetic control plane (selective or non-selective), it is apparent to a person skilled in the art how the invention is implemented when the embodiment supports both basic types.

Even though the invention is described above, for the sake of clarity, by means of embodiments that use only an explicit or implicit relation, the embodiments supporting both relations are apparent to a person skilled in the art. When defining the magnetic control plane the user may define whether implicit or explicit relations are used, or he may define that an explicit relation is created for a handle/object of a given type and an implicit relation is created for others. Definitions on the type of the relation to be used may also be integrated in the modeling program itself. Individual features of the above-described embodiments can be combined to provide other embodiments in accordance with the invention.

The modeling system implementing the functionality of the present invention comprises, in addition to means necessary for prior art surface modeling, means for providing and utilizing magnetic control planes. The modeling system may also comprise means for storing the magnetic control planes and/or means for storing the relations created thereby. To put it more precisely, the modeling system of the invention comprises means for implementing at least one embodiment of the invention. Conventional personal computers or terminal equipment and database servers comprise processors and memory that can be utilized in the functions of the invention. All changes and configurations needed for the implementation of the invention can be executed as added or updated software routines, with application specific integrated circuits (ASIC) and/or by otherwise configuring the existing system, particularly the modeling program. The software/ software routines can be stored in any data storage means readable with a computer.

It is apparent to a person skilled in the art that as technology advances the basic idea of the invention can be implemented in a variety of ways. The above-described embodiments of the inventions are only examples and they, or individual features described therein, can be combined in manners differing from those described above so as to provide new embodiments. Thus, the invention and the embodiments thereof are not restricted to the above-described examples, but they may vary within the scope of the claims.

The invention claimed is:

1. A method for enabling modification and/or movement of an object of a model in a modeling system, the method comprising the steps of:
   using a computer comprising a memory and a processor for editing the model in the modeling system;
   creating, in response to a received corresponding user input a planar object;
   defining, in response to a received corresponding user input, the planar object as a magnetic control plane, wherein the defining includes defining a magnetism of the magnetic control plane to be selective such that any other objects attached to the magnetic control plane do not necessarily adhere to the magnetic control plane, whereby a movement of the planar object defined as the magnetic control plane causes at least a part of other objects attached to the magnetic control plane to move correspondingly only when the other object or the part of the object adheres to the magnetic control plane;
   attaching an other object of the model to the planar object defined as the magnetic control plane by associating the other object with the planar object defined as the magnetic control plane;
   moving, in response to a received user input for moving the planar object defined as the magnetic control plane, said planar object defined as the magnetic control plane from a first location in the model to a second location in the model;
   modifying, in response to the moving of the planar object defined as the magnetic control plane, the other object attached to the planar object defined as the magnetic control plane by moving at least a part of the other object correspondingly to the moving of the planar object defined as the magnetic control plane without any further user input; and
   storing an outcome of the modifying caused by the moving.

2. The method of claim 1, wherein the other object, attached to the planar object defined as the magnetic control plane, is a three dimensional object extending outwards from the planar object defined as the magnetic control plane.

3. The method of claim 1, wherein the other object is attached to the planar object defined as the magnetic control plane by means of the part that is moved, whereas other parts of the other object that are not attached to the planar object defined as the magnetic control plane are not moved, thereby causing the modification of dimensions of the other object attached to the magnetic control plane.

4. The method of claim 1, wherein all parts of the other object that is attached to the planar object defined as the magnetic control plane are moved, thereby modifying the location of the other object in the model.

5. The method of claim 3, further comprising:
   in response to a user input indicating that the user selected the planar object defined as the magnetic control plane, collecting all parts attached to the planar object defined as the magnetic control plane.

6. The method of claim 1, further comprising:
   in response to the user input moving the planar object defined as a magnetic control plane, collecting other objects attached to the magnetic control plane prior to the moving of the planar object defined as the magnetic control plane.

7. The method of claim 1, further comprising:
   storing a definition of the magnetic control plane in the model;
   collecting other objects attached to the magnetic control plane;
   creating a relation between the magnetic control plane and each collected object;
   storing the relations in the model; and
   retrieving, in response to moving the magnetic control plane, the objects attached to the magnetic control plane by means of the relations.

8. The method of claim 7, further comprising:
   in response to creating, in response to a corresponding user input, the planar object, and after the defining of the planar object as the magnetic control plane, checking whether the other object attaches to the magnetic control plane; and
   upon the other object attaching to the magnetic control plane,
   i) creating a relation between the magnetic control plane and the other object, and
   ii) storing the relation in the model.

9. The method of claim 1, further comprising:
   defining a magnetism of the magnetic control plane to be selective such that any other objects attached to the magnetic control plane do not necessarily adhere to the magnetic control plane, whereby the moving of the planar object defined as the magnetic control plane causes at least a part of the other object attached to the magnetic control plane to move correspondingly only when the other object or the part of the object adheres to the magnetic control plane.

10. The method of claim 3, further comprising:
    having in the model at least two planar objects defined as magnetic control planes for the model;
    having in the memory at least one instruction that is followed in a contradicting situation defined as when a same part attaches to said at least two magnetic control planes and either one of said two magnetic control planes is moved such that the part will not be able to be attached to both of said two magnetic control planes; and
    acting according to the at least one instruction in the contradicting situation.

11. The method of claim 10, wherein, according to the at least one instruction, the user is asked for a solution of the contradicting situation.

12. The method of claim 1, wherein the defining the planar object as the magnetic control plane includes defining a thickness of the planar object.

13. The method of claim 1, wherein the planar object defined as the magnetic control plane is also used as a snap surface.

14. A method for enabling modification and/or movement of a part of a model in a modeling system implemented by a computer program stored and operative on a computer having a memory and a processor, the method comprising:
    using the computer to edit the model, the part of the model at least one handle for causing the part of the model to be grabbed and at least one of a shape and a location of the part of the model associated with the handle to be changed;

creating, with the computer that is executing the computer program, a plane for the model in response to a corresponding user input;

defining the plane as a magnetic control plane in response to a corresponding user input, wherein the defining includes defining a magnetism of the magnetic control plane to be selective such that any other objects attached to the magnetic control plane do not necessarily adhere to the magnetic control plane, whereby a movement of the planar object defined as the magnetic control plane causes at least a part of other objects attached to the magnetic control plane to move correspondingly only when the other object or the part of the object adheres to the magnetic control plane;

moving, in response to a user input moving the magnetic control plane, the magnetic control plane from a first location to another second location, thereby moving a handle of the part of the model located on the magnetic control plane, the move of the handle of the part of the model causing modification, including movement, of the part of the model part; and storing an outcome of the moving, wherein the handle of the part of the model is not used to initiate the movement of the magnetic plane.

15. A non-transitory computer-readable program storage medium embodying program instructions, executable by a computer, which instructions, when executed in the computer cause the computer to:

define a planar object created for a model as a magnetic control plane, wherein the defining includes defining a magnetism of the magnetic control plane to be selective such that any other objects attached to the magnetic control plane do not necessarily adhere to the magnetic control plane, whereby a movement of the planar object defined as the magnetic control plane causes at least a part of other objects attached to the magnetic control plane to move correspondingly only when the other object or the part of the object adheres to the magnetic control plane, a movement of which makes at least a part of an other object attached to the planar object defined as the magnetic control plane move correspondingly, and to modify, including moving a location in the model, in response to the move of the part, of the other object.

16. The storage medium of claim 15, wherein the program instructions further causes the computer to move, in response to moving the magnetic control plane, a handle of the other object, the handle of the other object being located on the magnetic control plane, correspondingly and for updating the other object according to the movement of the handle of the other object.

17. A non-transitory computer-readable program storage medium embodying program instructions, executable by a computer, which instructions, when executed in the computer cause the computer to:

define, in response to a corresponding user input, planar object created for a model as a magnetic control plane, wherein the defining includes defining a magnetism of the magnetic control plane to be selective such that any other objects attached to the magnetic control plane do not necessarily adhere to the magnetic control plane, whereby a movement of the planar object defined as the magnetic control plane causes at least a part of other objects attached to the magnetic control plane to move correspondingly only when the other object or the part of the object adheres to the magnetic control plane, a movement of which makes a handle of an other object, the handle being located on the planar object defined as the magnetic control plane, move correspondingly and to modify, in response to the move of the handle of the other object, said other object while maintaining the shape of the planar object of the plane type defined as the magnetic control plane.

18. A modeling system, comprising:
at least one a processor; and
at least one memory operatively connected to the processor and including stored therein computer program code, the computer program code being configured to, via the at least one processor, cause the modeling system at least to:

create a surface in response to a user input and to move the created surface in response to another user input, define, in response to a further user input, the surface as a magnetic control plane, wherein the defining includes defining a magnetism of the magnetic control plane to be selective such that any other objects attached to the magnetic control plane do not necessarily adhere to the magnetic control plane, whereby a movement of the planar object defined as the magnetic control plane causes at least a part of other objects attached to the magnetic control plane to move correspondingly only when the other object or the part of the object adheres to the magnetic control plane, such that a movement of which from one location to an other location makes a handle of a part of a model move correspondingly, where the handle is located on the surface but not associated with having a capability to move the surface, the handle of the part of the model allowing the part of the model to be grabbed and at least one of a shape and a location of the part of the model to be changed, the surface defined as the magnetic control plane not being movable by movement of the handle located on the surface, move, in response to a user input moving the surface defined as a magnetic control plane, the handle located on the surface defined as the magnetic control plane accordingly from the one location to the other location and to update the part of the model; and store updated information on the part of the model in response to the part of the model being updated.

19. The modeling system of claim 18, wherein the computer program code is configured to further cause the modeling system to collect all handles located on the magnetic control plane.

20. The modeling system of claim 19, wherein the computer program code is further configured to further cause the modeling system to:
store the definition of the magnetic control plane,
create a relation between the surface and the handle of the model part, the handle located on said surface defined as the magnetic control plane,
store the relation, and
retrieve the handle located on said surface defined as the magnetic control plane by means of the stored relation.

21. The modeling system of claim 18, wherein the computer program code is configured to further cause the modeling system to:
define, according to a received user input, a magnetism of the magnetic control plane to be selective such that all handles located on the surface defined as the magnetic control plane do not necessarily adhere to the magnetic control plane, and
to move the handle of the part of the model only when the handle adheres to the magnetic control plane.

22. The modeling system of claim 18, wherein the computer program code is configured to further cause the modeling system to:
    modify definition of the magnetic control plane, the is comprising a shape, dimension, thickness or magnetism of the magnetic control plane.

* * * * *